(12) United States Patent
Li

(10) Patent No.: US 9,929,267 B2
(45) Date of Patent: Mar. 27, 2018

(54) N-TYPE FIN FIELD-EFFECT TRANSISTOR AND FABRICATION METHOD THEREOF

(71) Applicant: Semiconductor Manufacturing International (Shanghai) Corporation, Shanghai (CN)

(72) Inventor: Yong Li, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/097,575

(22) Filed: Apr. 13, 2016

(65) Prior Publication Data

US 2016/0322494 A1 Nov. 3, 2016

(30) Foreign Application Priority Data

Apr. 30, 2015 (CN) .......................... 2015 1 0215957

(51) Int. Cl.
| | | |
|---|---|---|
| H01L 29/66 | (2006.01) | |
| H01L 29/78 | (2006.01) | |
| H01L 29/08 | (2006.01) | |
| H01L 29/16 | (2006.01) | |
| H01L 29/165 | (2006.01) | |
| H01L 29/167 | (2006.01) | |
| H01L 21/265 | (2006.01) | |
| H01L 21/225 | (2006.01) | |

(52) U.S. Cl.
CPC .... *H01L 29/7848* (2013.01); *H01L 21/26586* (2013.01); *H01L 29/0847* (2013.01); *H01L 29/165* (2013.01); *H01L 29/167* (2013.01); *H01L 29/1608* (2013.01); *H01L 29/66575* (2013.01); *H01L 29/66803* (2013.01); *H01L 29/7833* (2013.01); *H01L 29/7851* (2013.01); *H01L 21/2253* (2013.01); *H01L 21/26513* (2013.01)

(58) Field of Classification Search
CPC .................................................. H01L 29/66803
See application file for complete search history.

(56) References Cited

U.S. PATENT DOCUMENTS

2008/0265321 A1* 10/2008 Yu ..................... H01L 21/26586
257/344
2014/0117426 A1* 5/2014 Cho .................... H01L 21/7624
257/288

(Continued)

*Primary Examiner* — Peniel M Gumedzoe
*Assistant Examiner* — Christopher Johnson
(74) *Attorney, Agent, or Firm* — Anova Law Group, PLLC

(57) ABSTRACT

The present disclosure provides N-type fin field-effect transistors and fabrication methods thereof. A method for fabricating an N-type fin field-effect transistor includes providing a semiconductor substrate; forming at least one fin having a first side surface and a second side surface over the semiconductor substrate; forming a gate structure crossing over the fin over the semiconductor substrate; performing an ion implantation process on one of the first side surface and the second side surface of the fin at two sides of the gate structure; performing a thermal annealing process to cause doping ions to diffuse to the other one of the first side surface and the second side surface of the fin; and forming a source region and a drain region on the fin at the two sides of the gate structure, respectively.

15 Claims, 6 Drawing Sheets

(56) References Cited

U.S. PATENT DOCUMENTS

2015/0206973 A1\* 7/2015 Oyu .................. H01L 29/41
  257/401
2016/0141387 A1\* 5/2016 Tseng ............... H01L 29/66537
  257/401

\* cited by examiner

N-TYPE FIN FIELD-EFFECT TRANSISTOR AND FABRICATION METHOD THEREOF

CROSS-REFERENCES TO RELATED APPLICATIONS

This application claims the priority of Chinese patent application No. 201510215957.2, filed on Apr. 30, 2015, the entirety of which is incorporated herein by reference.

FIELD OF THE INVENTION

The present invention generally relates to the field of semiconductor technology and, more particularly, relates to N-type fin field-effect transistors and fabrication processes thereof.

BACKGROUND

With the continuous shrinking of the technical nodes of semiconductor technology, the semiconductor technology has gradually transitioned from planar CMOS transistors to three-dimensional fin field-effect transistors (FinFETs). In a FinFET, the gate structure is able to control the channel region from at least two sides. Thus, comparing with the planar MOSFET, the FinFET has a significantly higher control ability to the channel region. Accordingly, the FinFET is able to effectively inhibit the short-channel effect, etc. Further, the FinFET has a desired compatibility with the existing fabrication techniques of integrated circuits (ICs).

FIGS. 1-2 illustrate an existing fabrication process of a FinFET. As shown in FIGS. 1-2, the process includes providing a semiconductor substrate 10; and forming a plurality of fins 11 on the semiconductor substrate 10. Specifically, the semiconductor substrate 10 includes a silicon substrate 101 having at least two discrete protruding structures (not labeled), and an insulation layer 102 formed between the protruding structures. The top surface of the insulation layer 102 is lower than the top surfaces of the protruding structures. The portions of the protruding structures higher than the top surface of the insulation layer 102 are configured as the fins 11.

Further, the process also includes forming a gate structure 12 crossing over the fins 11. The gate structure 12 includes a gate oxide layer 121 and a gate electrode layer 122 formed on the gate oxide layer 121.

Further, referring to FIG. 2, the process also includes performing a lightly-doped drain (LDD) ion implantation process on the two sides of the fins 11 to form LDD ion implanting regions. Each of the fins 11 includes a first side surface 111 and a second side surface 112 facing the first side surface 111 of an adjacent fin. The LDD ion implantation process is performed on the first side surfaces 111 of the fins 11 first; and then performed on the second side surfaces 112 of the fins 11. The doping ions of the LDD ion implantation process are phosphorous ions.

Further, the process also includes forming a silicon carbide layer (not shown) on the surface of the fins 11 at both sides of the gate structure 12. The silicon carbide layer is formed by an in-situ doping growth process. That is, the silicon carbide layer is doped with source and drain doping ions. Thus, the source region and the drain region of the N-type FinFET are formed. The source and drain doping ions are phosphorous ions.

Further, a silicon cap (Si Cap) layer is formed on the silicon carbide layer; and a metal layer is formed on the Si Cap layer. A thermal annealing process is performed on the metal layer; and the metal layer and Si Cap are melted together to form a metal silicide layer.

However, the performance of the N-type FinFETs formed by the existing techniques may be unable to match the desired requirements. The disclosed device structures and methods are directed to solve the problem.

BRIEF SUMMARY OF THE DISCLOSURE

One aspect of the present disclosure includes a method for fabricating an N-type fin field-effect transistor. The method includes providing a semiconductor substrate; forming at least one fin having a first side surface and a second side surface over the semiconductor substrate; forming a gate structure crossing over the fin and over the semiconductor substrate; performing an ion implantation process on one of the first side surface and the second side surface of the fin and at two sides of the gate structure; performing a thermal annealing process such that doping ions are diffused into the other of the first side surface and the second side surface of the fin; and forming a source region and a drain region on the fin at the two sides of the gate structure, respectively.

Another aspect of the present disclosure includes an N-type fin field-effect transistor. The N-type fin field-effect transistor includes a semiconductor substrate; at least one fin having a first side surface and a second side surface formed over the semiconductor substrate; a gate structure crossing over the fin and formed over the semiconductor substrate; and a source region and a drain region formed on top of the fin at two sides of the gate structure, respectively. Wherein the source region and the drain region are formed by performing an ion implantation process on one of the first side surface and the second side surface of the fin at two sides of the gate structure; performing a thermal annealing process such that doping ions are diffused into the other of the first side surface and the second side surface of the fin; and forming the source region and the drain region on the fin at the two sides of the gate structure, respectively.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
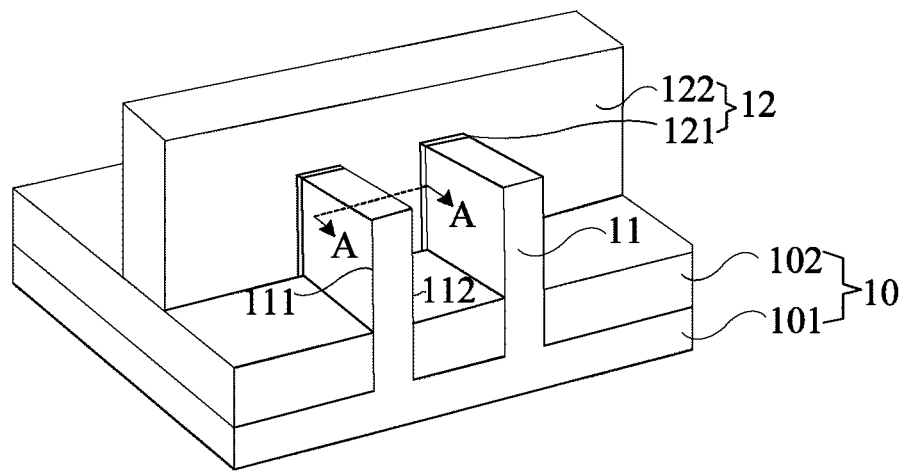
FIG. 1 illustrates an existing semiconductor substrate and gate structures formed on the semiconductor substrate.
Figure 2:
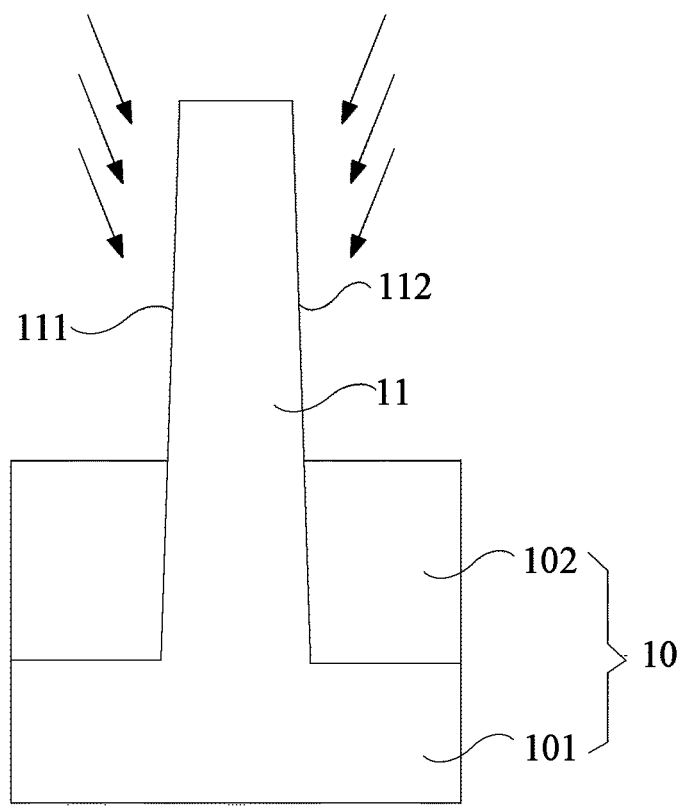
FIG. 2 illustrates the cross-sectional view of the structure illustrated in FIG. 1 along the AA direction.

Referring to FIG. 2, for the N-type FinFET, the ions of the LDD ion implanting process are phosphorous ions; and the dosage of the LDD ion implantation process may be relatively large. When the LDD ion implantation process is performed at the two sides of the gate structure 12, the LDD ion implantation process may be performed on the first side surfaces 111 of the fins 11 first, followed by performing the LDD ion implantation process on the second side surfaces 112 of the fins 11. After the two LDD ion implantation processes, the crystal lattice of the fins 11 may be severely damaged; and the damage to the top of the fins 11 may be more severe.

For planar transistors, the LDD ion implantation processes may also damage the surface of the semiconductor substrate. However, the damage to the surface of the semiconductor substrate may be timely repaired by a subsequent thermal annealing process because the semiconductor substrate may have a significantly large portion of single crystal silicon; and the single crystal silicon may lateral diffuse and grow to the damaged area.

However, for the FinFETs, the critical dimension of the fins 11 is substantially small, even a thermal annealing process is subsequently performed; it may still be difficult for the single crystal silicon in the silicon substrate 101 to grow along the direction from the bottom of the protruding structure to the top of the protruding structure (fins). Thus, the single crystal silicon in the silicon substrate 101 may be unable to grow to repair the damage in the fins 11, especially for the top of the fins 11. That is, the subsequent thermal annealing process may be unable to repair the damage to the fin 11. Thus, twin defects may be formed in the fins 11. The twin defects may become more severe from the bottom of the fins 11 to the top of the fins 11. Such twin defects may adversely affect the performance of the subsequently formed FinFETs.

Figure 8:
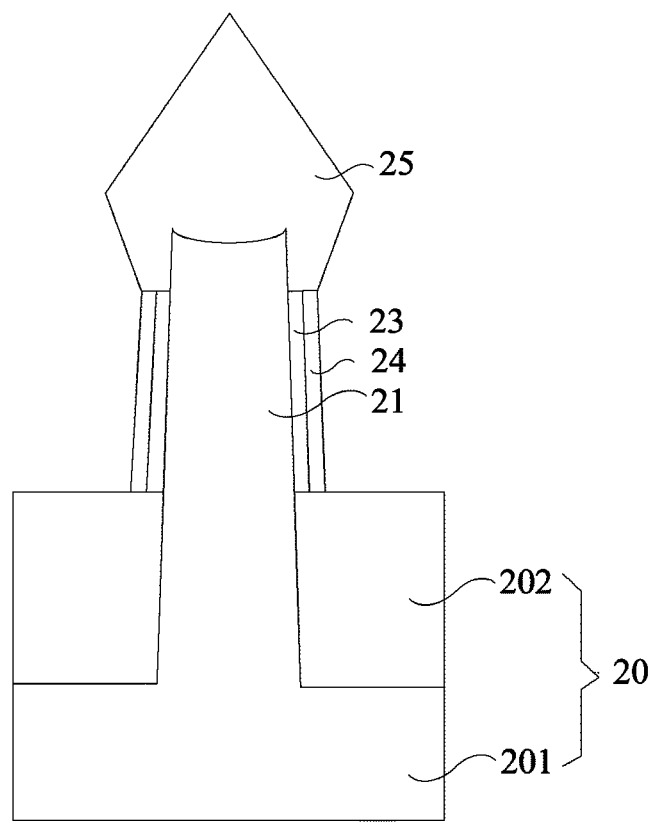
Figure 9:
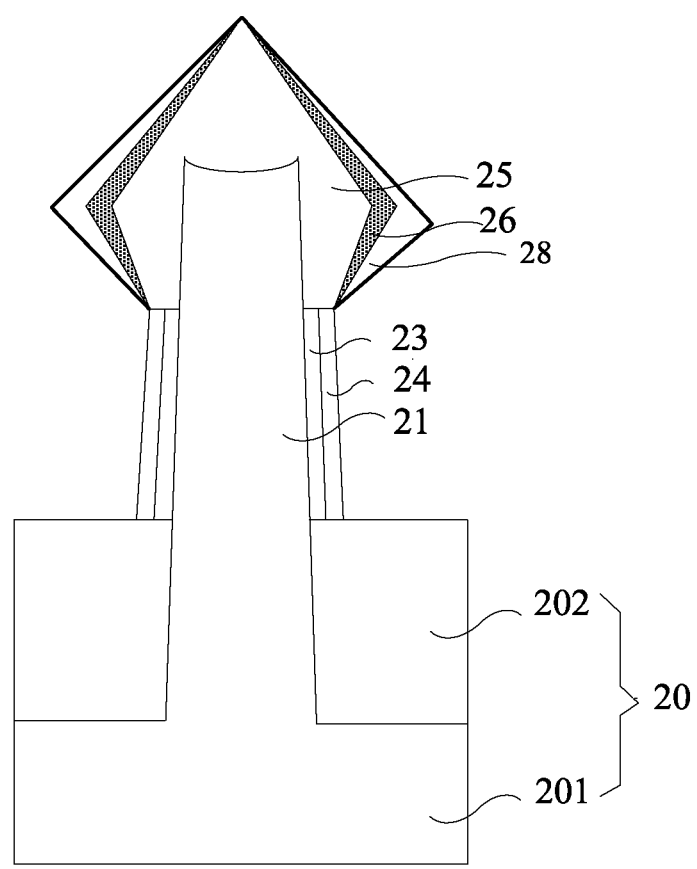
Figure 10:
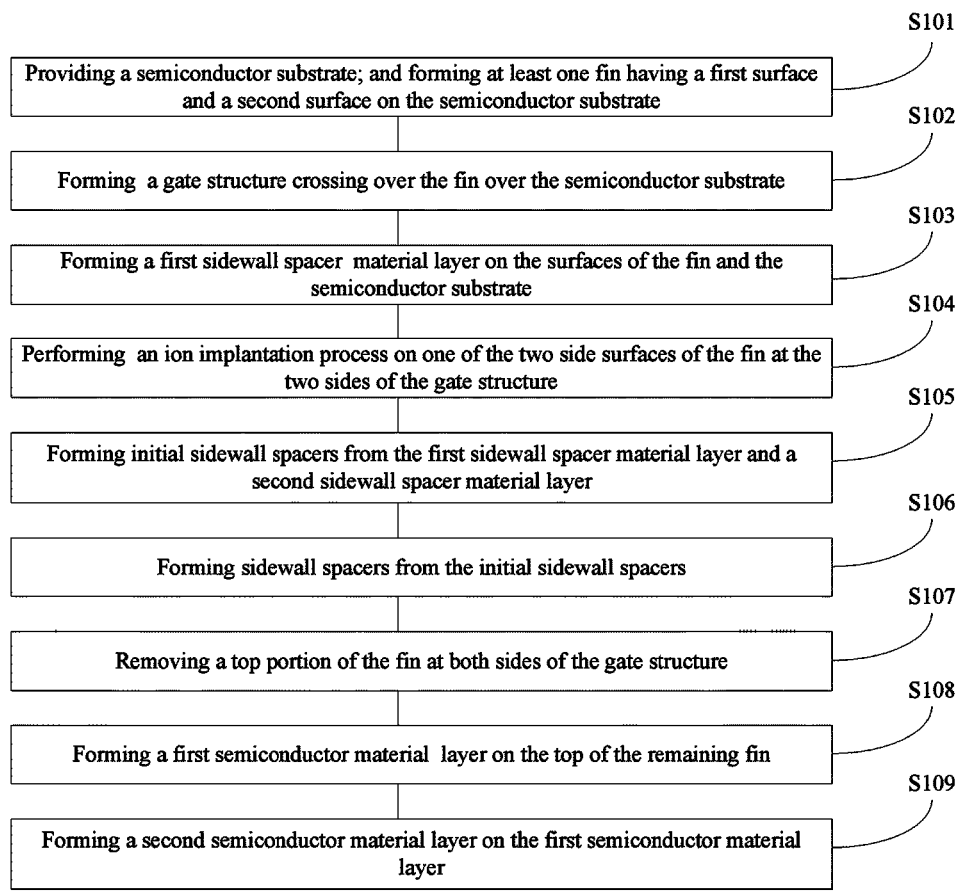
FIG. 10 illustrates an exemplary fabrication process of an N-type FinFET consistent with the disclosed embodiments.

FIG. 10 illustrates an exemplary fabrication process of a FinFET consistent with the disclosed embodiments; and FIGS. 3-9 illustrate semiconductor structures corresponding to certain stages of the exemplary fabrication process.

Figure 3:
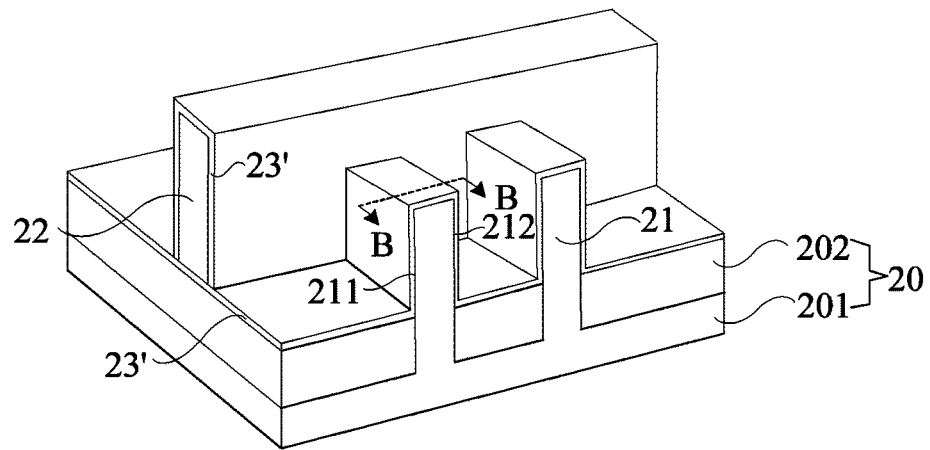
FIG. 3 illustrates an exemplary semiconductor structure for forming an exemplary fin field-effect transistor consistent with the disclosed embodiments.

As shown in FIG. 10, at the beginning of fabrication process, a semiconductor substrate with certain structures is provided (S101). FIG. 3 illustrates a corresponding semiconductor structure; and FIG. 4 illustrates a cross-sectional view of the structure illustrated in FIG. 3 along the BB direction.

Figure 4:
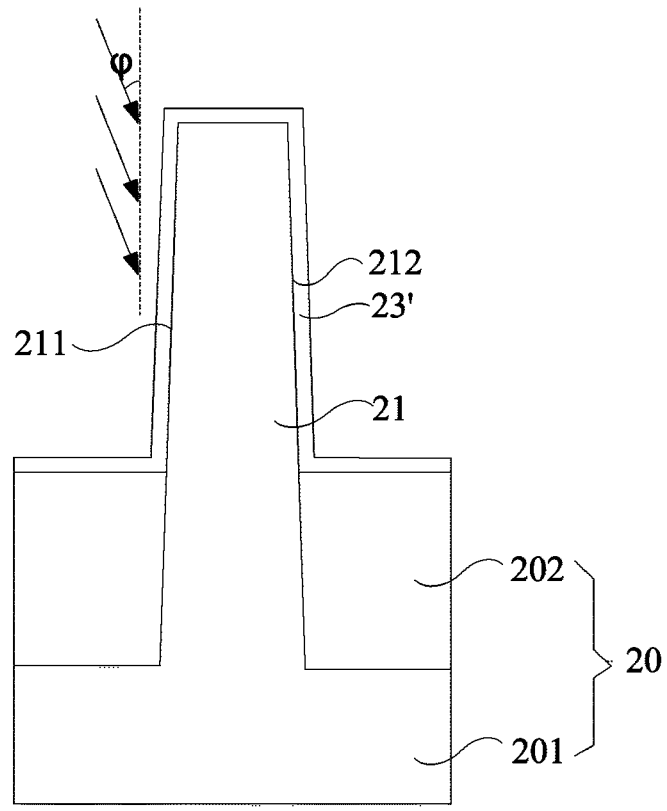
FIG. 4 illustrates a cross-sectional view of the structure illustrated in FIG. 3 along the BB direction consistent with the disclosed embodiments.

As shown in FIGS. 3-4, a semiconductor substrate 20 is provided. The semiconductor substrate 20 may have a plurality of fins 21.

Each of the plurality of fins 21 may include a first side surface 211, a second surface 212, and a top surface (not labeled). The first side surface 211 may be on an opposite side of the second side surface 212. The distance between the first side surface 211 and the second side surface 212 of the same fin may be substantially small; and may be referred as the critical dimension of the fins 11. The distance between the first side surface 211 and the second side surface 212 may also be referred to as a width of the fins 21.

In one embodiment, the distance between the top of the first side surface 211 and the top of the second side surface 212 may be equal to or smaller than approximately 10 nm. The distance between the bottom of the first side surface 211 and the bottom of the second side surface 212 may be equal to, or smaller than approximately 20 nm. That is, the top width of the fins 21 may be equal to or smaller than approximately 10 nm; and the bottom width of the fins 21 may be equal or smaller than approximately 20 nm.

In one embodiment, the semiconductor substrate 20 may include a silicon substrate 201 having at least two protruding structures (not labeled); and an insulation layer 202 may be formed between adjacent protruding structures. The top surface of the insulation layer 202 may be lower than the top surfaces of the protruding structures; and the portions of the protruding structures higher than the top surface of the insulation layer 202 may be configured as the fins 21. The insulation layer 202 may be made of silicon oxide.

In certain other embodiments, the semiconductor substrate 20 may be a silicon-on-insulator (SOI) substrate. The SOI substrate may include a bottom silicon base substrate, an insulation layer on the bottom silicon base substrate, and a top silicon layer on the insulation layer. The fins 21 may be formed by etching the top silicon layer.

In still certain other embodiments, the semiconductor substrate 20 may be made of any appropriate semiconductor materials, such as polysilicon, germanium on insulator (GOI), silicon germanium, carborundum, indium antimonite, lead telluride, indium arsenide, indium phosphide, gallium arsenide, gallium antimonite, alloy semiconductor, or a combination thereof. The fins 21 may be formed by etching the semiconductor substrate 20, or forming protruding structures on a base semiconductor substrate. The insulation layer 202 may be made of any insulating materials, such as silicon oxynitride, or silicon oxycarbide, etc.

Returning to FIG. 10, after providing the semiconductor substrate 20 having the fins 21 and the insulation layer 202, a gate structure may be formed (S102). FIGS. 3-4 illustrate a corresponding semiconductor structure.

As shown in FIGS. 3-4, a gate structure 22 may be formed (S102). The gate structure 22 may cross over a length of the fins 21.

The gate structure 22 may include a gate dielectric layer (not labeled) and a gate electrode layer (not labeled) formed on the gate dielectric layer. The gate electrode layer may be made of any appropriate material. For example, when the gate dielectric layer is made of silicon oxide, the gate electrode layer may be made of poly silicon. When the gate dielectric layer is made of high-K dielectric material, the gate electrode layer may be made of a metal material. The high-K dielectric material may include $HfO_2$, $Al_2O_3$, $ZrO_2$, HfSiO, HfSiON, HfTaO, or HfZrO, etc.

The gate structure 22 may be formed by forming a gate dielectric material layer covering the fins 21 and the silicon substrate 200; forming a gate electrode material layer on the gate dielectric layer; and patterning the gate electrode material layer and the gate dielectric material layer. Thus, the gate structure 22 crossing over the fins 21 may be formed.

Various processes may be used to form the gate dielectric layer, such as a chemical vapor deposition (CVD) process, a physical vapor deposition (PVD) process, an atomic layer deposition (ALD) process, or a flowable CVD (FCVD) process, etc. Various processes may be used to form the gate electrode layer, such as a CVD process, a PVD process, an FCVD process, or an electroplating process, etc. The gate electrode material layer and the gate dielectric layer may be patterned by any appropriate process, such as a dry etching process, or a wet etching process, etc.

Returning to FIG. 10, after forming the gate structure 22, a first sidewall spacer material layer may be formed (S103). FIGS. 3-4 illustrate a corresponding semiconductor structure.

As shown in FIGS. 3-4, a first sidewall spacer material layer 23' is formed on semiconductor substrate 20, the side and top surfaces of the fins 21 and the side and top surfaces of the gate structure 22. The first sidewall spacer material layer 23' may define the position of the subsequently ion implantation process.

The first sidewall spacer material layer 23' may be a single layer structure, or a multi-layered structure. In one embodiment, the first sidewall spacer material layer 23' is a double-layer structure including a silicon oxide layer (not labeled) formed on the bottom; and a silicon nitride layer (not labeled) formed on the silicon oxide layer. In certain other embodiments, the first sidewall spacer material layer 23' may be made of any appropriate materials. The first sidewall spacer material layer 23' may be formed by any appropriate process, such as one or more of a CVD process, a PVD process, or an FCVD process, etc.

Returning to FIG. 10, after forming the first sidewall spacer material layer 23', an ion implantation process may be performed (S104). FIG. 4 illustrates a corresponding semiconductor structure. For illustrative purposes, one fin 21 will be described.

As shown in FIG. 4, an ion implantation process is performed on one of the two side surfaces of the fins 21 at the two sides of the gate structure 22. In one embodiment, the ion implantation process is an LDD ion implantation process. In certain other embodiments, the ion implantation process may be other appropriate ion implantation process.

The doping ions of the LDD ion implantation process may be any appropriate ions. In one embodiment, the doping ions of the LDD ion implantation process are phosphorous ions.

Further, as shown in FIG. 4, in one embodiment, the LDD ion implantation process may be performed on the first side surface 211 of the fin 21. In certain other embodiments, the LDD ion implantation process may be performed on the second side surface 212 of the fin 21.

After the ion implantation process, a thermal annealing process may be formed; and LDD implanting regions (not shown) may be formed. The thermal annealing process may be any appropriate process. In one embodiment, the thermal annealing process is a spike annealing process. The temperature of the spike annealing process may be in a range of approximately 850° C.-1150° C. The duration of the spike annealing process may be in a range of approximately 0.5 s-2 s. Such a spike annealing process may be able to cause the LDD regions to diffuse into a required position on the bottom of the gate structure 22; and may also be able to minimize the thermal budget.

In one embodiment, the LDD ion implantation process may only be performed on one side surface of the fin 21, such as the first side surface 211. During the thermal annealing process, because the distance between the first side surface 211 and the second side surface 212 of the fin 21 may be substantially small, the ions of the LDD ion implantation process may diffuse to the second side surface 212; and may be activated. Thus, the LDD ion implanting regions may be formed in the fin 21.

In one embodiment, the LDD implanting regions may be formed by one LDD ion implantation process. Thus, the number of the LDD ion implantation processes for forming the LDD implanting regions may be reduced. Accordingly, the damage to the entire fin 21, especially the damage to the top of the fin 21, may be significantly reduced.

Further, in one embodiment, the crystal lattice of the fin 21 close to the first side surface 211 may be damaged after the LDD ion implantation process, but the crystal lattice of the fin 21 close to the second side surface 212 may not be damaged; and may still be single silicon. Thus, during the thermal annealing process after the LDD ion implantation process, the single crystal silicon at the side of the second side surface 212 may be re-grown to the first side surface 211; and the majority of the crystal lattice defects in the fin 21 may be repaired.

Further, referring to FIG. 4, in one embodiment, the ion implanting direction and the normal direction perpendicular to a top surface of the semiconductor substrate 20 may have an angle "φ". The angle "φ" may be greater than 0 and equal to or smaller than 30°. If the angle "φ" is significantly large, other fins adjacent to the fins 21 may prevent the ions from contacting with the fins 21 during the LDD ion implantation process. That is, the first side surface 211 may not be doped with ions. If the angle "φ" is equal to 0, the LDD regions may not have a desired effect; and the damage to the top of the fins 21 may be significantly increased.

In one embodiment, if the doping ions of the LDD ion implantation process are arsenic ions, the energy used in the LDD ion implantation process may be in a range of approximately 200 eV-5 KeV. The dosage of the doping ions may be in a range of approximately 1E13 atom/cm$^2$-2E15 atom/cm$^2$.

In one embodiment, if the doping ions of the LDD ion implantation process are phosphorous ions, the energy used in the LDD ion implantation process may be in a range of approximately 100 eV-5 KeV. The dosage of the doping ions may be in a range of approximately 1E13 atom/cm$^2$-2E15 atom/cm$^2$.

If the energy and the dosage of the LDD ion implantation process are too large, the fin 21 may be broken down; and the entire fin 21 may become amorphous silicon. During the spike annealing process, although the single crystal silicon in the silicon substrate 201 may grow along the direction from the bottom of the protruding structure to the top of the fin 21, it may be unable to repair the fins 21; and the performance of the subsequently formed N-type FinFET may still be adversely affected.

If the energy and the dosage of the LDD ion implantation process are too small, the LDD ion implanting regions may not have desired effects and corresponding functions to the subsequently formed N-type FinFET. Even worse, it may be unable to form LDD ion implantation regions.

The combination of the selected angle "φ", the selected energy of the LDD ion implantation process, the selected dosage of the LDD ion implantation process, and the corresponding thermal annealing process may optimize the performance of the LDD ion implanting regions. At the same time, the damage to the fins 21 may be minimized. In certain other embodiments, the angle "φ", the energy of the LDD ion implantation process, the dosage of the LDD ion implantation process, and the thermal annealing process may have other appropriate combinations.

Figure 5:
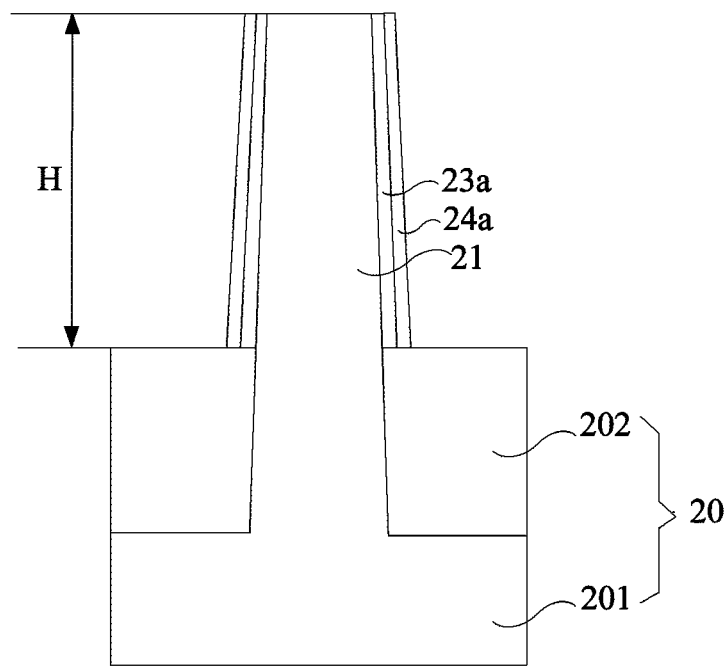
FIGS. 5-9 illustrate semiconductor structures corresponding certain stages of an exemplary fabrication process of an N-type FinFET consistent with the disclosed embodiments.

Returning to FIG. 10, after forming the LDD implanting regions, initial sidewall spacers may be formed (S105). FIG. 5 illustrates a corresponding semiconductor structure.

As shown in FIG. 5, initial sidewall spacers (not labeled) are formed on the side surfaces of the fin 21. The initial sidewall spacers may be used to subsequently form sidewall spacers to define the positions of the subsequently formed source electrode and drain electrode. The height of the initial sidewall spacers, i.e. a distance between the top surface of the initial side spacers and the top surface of the insulation layer 202, may be referred to as an initial height "H".

In one embodiment, the top surfaces of the initial sidewall spacers may level with the top surface of the fin 21. Thus, the height the fin 21, i.e., a distance between the top surface of the fin 21 and the top surface of the insulation layer 202, may also be equal to the initial height "H".

The initial sidewall spacers may include initial silicon oxide sidewall spacers 23a on the side surfaces of the fin 21; and initial silicon nitride sidewall spacer 24a. The initial silicon oxide sidewall spacers 23a may be the buffer layer of the initial silicon nitride sidewall spacers 24a. If the initial silicon oxide spacers 23a are omitted, the initial silicon nitride sidewall spacers 24a may generate a relatively large stress to the fin 21. Because the critical dimension of the fin 21 may be substantially small, the relatively large stress may cause the silicon in the fins 21 to have dislocations. The dislocations may significantly affect the performance of the subsequently formed N-type FinFET.

The process for forming the initial sidewall spacers may include forming a second sidewall spacer material layer (not shown) on the first sidewall spacer material layer 23', followed by performing an etch-back process to the first sidewall spacer material layer 23' and the second sidewall spacer material layer. Thus, the initial sidewall spacers may be formed on the side surfaces of the fin 21.

The second sidewall spacer material layer may be made of any appropriate material. In one embodiment, the second sidewall spacer material layer is made of silicon nitride. Thus, the initial silicon oxide sidewall spacers 23a may be formed from the silicon oxide layer of the first sidewall spacer material layer 23'. The initial silicon nitride sidewall spacers 24a may be formed from the silicon nitride layer of the first sidewall spacer material layer 23' and the second sidewall spacer material layer.

The second sidewall spacer material layer may be formed by any appropriate process, such as a CVD process, an ALD process, or an FCVD process, etc. The etch-back process may be a dry etching process, or an ion beam etching process, etc.

The structure illustrated in FIG. 5 may be used to subsequently form an N-type FinFET. A silicon carbide layer may be subsequently formed on the fin 21. The growth rate of the silicon carbide layer may be relatively small. If the silicon carbide layer is directly formed on the top surface of the fin 21, because the size of the top surface of fin 21 may substantially small; and the top of the fin 21 may be covered by the initial sidewall spacers, the growth rate of the silicon carbide layer may be substantially small; and the efficiency of the fabrication process of the FinFET may be significantly affected. Further, in the limited space on the top of the fin 21, the volume of the silicon carbide layer formed on the top surface of the fin 21 may be relatively small; and the silicon carbide layer may be unable to apply a desired stress on the fin 21 to increase the carrier mobility.

Figure 6:
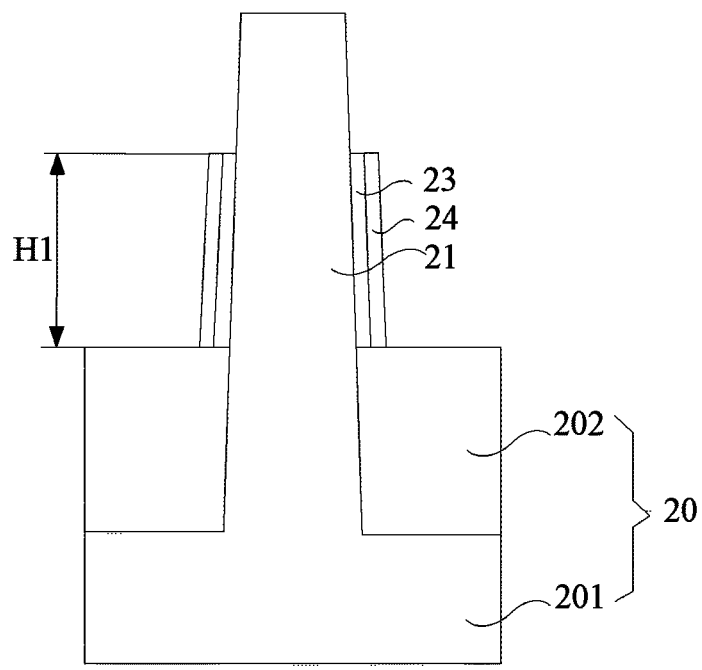

Thus, returning to FIG. 10, after forming the initial sidewall spacers, a partial height of the initial sidewall spacers may be removed; and sidewall spacers may be formed (S106). FIG. 6 illustrates a corresponding semiconductor structure.

As shown in FIG. 6, a partial height of the initial sidewall spacers is removed from the top; and sidewall spacers (not labeled) may be formed. That is, the top portion of the initial sidewall spacers may be removed. The height of the sidewall spacers after the removal process may be referred to as a first sidewall height "H1".

In one embodiment, the top portion of the initial silicon nitride sidewall spacers 24a may be removed first. The remaining silicon nitride sidewall spacers may be referred to as silicon nitride sidewall spacers 24. The height of the silicon nitride sidewall spacers 24 may be equal to the first sidewall height "H1".

The top portion of the initial silicon nitride sidewall spacers 24a may be removed by any appropriate process, such as a dry etching process, or a wet etching process, etc. In one embodiment, a dry etching process is used to remove the top portion of the initial silicon nitride sidewall spacers 24a. The etching gas may include $CHF_3$, etc. The diluting or carrier gas may include Ar, etc. Specifically, the flow rate of $CHF_3$ may be in a range of approximately 1 sccm-200 sccm. The flow rate of Ar may be in a range of approximately 10 sccm-500 sccm. The pressure of the dry etching process may be in a range of approximately 10 mTorr-200 mTorr. The frequency of the plasma of the dry etching process may be in a range of approximately 0.1 Hz-1000 Hz. The power of the plasma may be in a range of approximately 50 W-500 W. The bias power of the plasma may be in a range of approximately 0 W-200 W. The duty cycle may be in a range of approximately 10%-90%.

After forming the silicon nitride sidewall spacers 24 with the first sidewall height "H1", the initial silicon oxide sidewall spacers 23a may be exposed. The top portion of the initial silicon oxide sidewall spacers 23a may then be removed; and the remaining silicon oxide sidewall spacers may be referred as silicon oxide sidewall spacers 23. The height of the silicon oxide sidewall spacers 23 may also be equal to the first sidewall height "H1".

The top portion of the initial silicon oxide sidewall spacers 23a may be removed by any appropriate process, such as a dry etching process, or a wet etching process, etc. In one embodiment, a dry etching process is used to remove the top portion of the initial silicon oxide sidewall spacers 23a. The etching gas may include $C_4H_8$, etc. The diluting gas may include Ar, etc. Specifically, the flow rate of $C_4H_8$ may be in a range of approximately 1 sccm-200 sccm. The flow rate of Ar may be in a range of approximately 10 sccm-500 sccm. The pressure of the dry etching process may be in a range of approximately 10 mTorr-200 mTorr. The frequency of the plasma of the dry etching process may be in a range of approximately 0.1 Hz-1000 Hz. The power of the plasma may be in a range of approximately 50 W-500 W. The bias power of the plasma may be in a range of approximately 0 W-200 W. The duty cycle may be in a range of approximately 10%-90%.

By using the above described dry etching processes to reduce the height of the initial sidewall spacers from the initial height "H" to the first sidewall height "H1" to form the sidewall spacers, the top portion of the fin 21 may be exposed; and the top surface of the fin 21 may be concavely shaped (not shown). That is, the top of the fin 21 may be a bowl-shaped pit. The inner surface of the bowl-shaped pit may be relatively uniform and smooth. The bowl-shaped pit may cause the top surface of the fin 21 to have a concave shape after the top portion of the fin 21 is subsequently removed.

Figure 7:
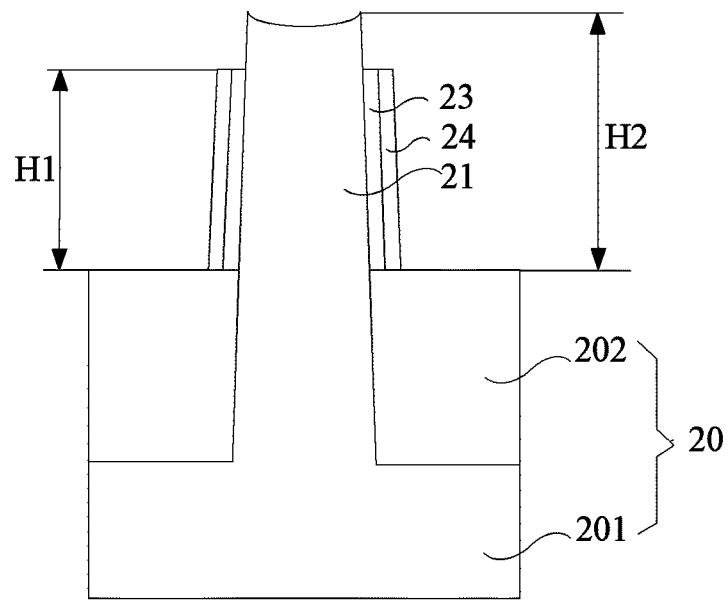

Returning to FIG. 10, after removing the top portion of the initial sidewall spacers to form the sidewall spacers, a portion of the fin 21 may be removed (S107). FIG. 7 illustrates a corresponding semiconductor structure.

As shown in FIG. 7, the portion of the fin 21 at both sides of the gate structure 22 is removed; and the height of the fin is reduced from the initial height "H" to a first fin height "H2". Further, the top surface of the remaining fin 21 may be concave-shaped.

The concave-shaped top surface of the fin 21 may be a regular arc surface with a certain radian. The arc surface may be relatively uniform and smooth.

A first semiconductor material layer may be subsequently formed on the top surface of the fin 21. The relatively uniform and smooth arc surface may cause the first semiconductor material layer to have a regular shape. The regular shape may prevent the first semiconductor layers formed on adjacent fins 21 from contacting during the growth process. Accordingly, the short-circuit phenomena between the subsequently source metal vias, between the subsequently formed drain metal vias, and/or between the subsequently formed source metal via and the subsequently formed drain metal via may be avoided.

The first fin height "H2" may be greater than or equal to approximately ⅔ of the initial height "H" (i.e., ⅔H), and smaller or equal to approximately ⅚ of the initial height (i.e., ⅚H). That is, the height of the portion of the fin 21 that is removed may be equal to or greater than approximately ⅙ of the initial height "H" (⅙H), and smaller or equal to ⅓ of the initial height "H" (⅓H).

If the fin 21 is removed too much, the size of the channel region of the N-type FinFET may be affected. Accordingly, the performance of the N-type FinFET may be affected. If the fin 21 is removed too little, the growth rate of the subsequently formed first semiconductor material layer may be substantially small; and the efficiency of the fabrication process may be substantially low.

Further, as shown in FIG. 7, the sidewall spacers may be lower than the remaining fin 21. That is, the first sidewall height "H1" may be smaller than the first fin height "H2". Such a geometry may cause the entire top of the remaining fin 21 to be exposed so as to increase growth rate of the subsequently formed first semiconductor material layer. Further, the volume of the subsequently formed first semiconductor material layer may be increased. Thus, the stress applied on the channel region may be as desired; and the performance of the subsequently formed N-type FinFET may be improved.

In one embodiment, the first sidewall height "H1" may be greater than or equal to approximately ⅓ of the initial height "H" (i.e., ⅓H), and smaller than approximately ⅔ of the initial height "H" (i.e., ⅔H). If the initial sidewall spacers are reduced too much, the volume of the first semiconductor material layer subsequently formed on the remaining fin 21 may be significantly large; and it may cause the first semiconductor material layers formed on adjacent remaining fins 21 to contact during the growth process. If the initial sidewall spacers are reduced too little, the growth rate of first semiconductor material layer subsequently formed on the remaining fin 21 may be substantially low. The performance of the subsequently formed N-type FinFET may be affected. When the first sidewall height "H1" is greater than or equal to approximately ⅓ of the initial height "H" (i.e., ⅓H), and smaller than approximately ⅔ of the initial height "H" (i.e., ⅔H), the semiconductor material layer subsequently formed on the remaining fin 21 may apply an optimized stress on the channel region of the N-type FinFET; and the growth time of the first semiconductor material layer may be minimized.

In certain other embodiments, the height of the sidewall spacers may be equal to the height of the remaining fin 21. That is, the first sidewall height "H1" may be equal to the first fin height "H2".

The top portion of the fin 21 may be removed by any appropriate process, such as a dry etching process, a wet etching process, or a chemical mechanical polishing process, etc. In one embodiment, the top portion of the fin 21 is removed by a dry etching process to reduce the height of the fin 21 from the initial height "H" to the first fin height "H2".

Returning to FIG. 10, after forming removing the top portion of the fin 21, a first semiconductor material layer may be formed (S108). FIG. 8 illustrates a corresponding semiconductor structure.

As shown in FIG. 8, a first semiconductor material layer 25 is formed on the top surface of the remaining fin 21. The first semiconductor layer material 25 may be doped with ions for forming source and drain regions.

The first semiconductor material layer 25 may have a certain regular shape. In one embodiment, as shown in FIG. 8, the first semiconductor material layer 25 has a shape including a combination of a triangle and a trapezoid.

Any appropriate ions may be used for forming the source and drain regions. In one embodiment, the ions doped in the first semiconductor layer 25 for forming the source and drain regions are phosphorous ions.

The first semiconductor material layer 25 may be made of any appropriate material. In one embodiment, the first semiconductor material layer 25 is made of silicon carbide, or silicon.

Various processes may be used to form the first semiconductor material layer 25, such as a CVD process, an FCVD process, or an epitaxial growth process, etc. In one embodiment, the first semiconductor material layer 25 doped with the source and drain ions is formed by an in situ doping growth process. The in situ doping growth process may be relatively easy to control; and may achieve a gradient doping.

In certain other embodiments, the first semiconductor material layer 25 may be formed on the remaining fin 21 first. Then, a source and drain ion implantation process may be performed on the first semiconductor material layer 25; and a thermal annealing process may be performed on the first semiconductor material layer 25 after the ion implantation process.

After forming the first semiconductor material layer 25, the first semiconductor material layer 25 with the certain shape may generate a tensile stress to the channel region of the subsequently formed N-type FinFET. Thus, the performance of the subsequently formed N-type FinFET may be improved.

Returning to FIG. 10, after forming the first semiconductor material layer 25, a second semiconductor material layer may be formed (109). FIG. 9 illustrates a corresponding semiconductor structure.

As shown in FIG. 9, a second semiconductor material layer 26 is formed on the first semiconductor material layer 25. The second semiconductor material layer 26 may be doped with potential barrier-reducing ions.

The second semiconductor layer 26 may be made of any appropriate material, such as silicon, silicon carbide, silicon germanium, or germanium, etc. In one embodiment, the second semiconductor layer 26 is made of silicon. Thus, the semiconductor layer 26 may also be referred as a silicon cap (Si cap) layer. In certain other embodiments, the second semiconductor material layer 26 is made of silicon carbide. The barrier-reducing ions may be any appropriate ions, such as one or more of S ions, Se ions, As ions, Sb ions and Ge ions, etc.

The second semiconductor material layer 26 doped with the potential barrier-reducing ions may be formed by any appropriate process. In one embodiment, an in situ doping growth process may be used to form the second semiconductor material layer 26 doped with the potential barrier-reducing ions. During the epitaxial growth of the second semiconductor material, such as Si, one or more doping gas containing the S ions, the Se ions, the As ions, the Sb ions, and the Ge ions may be in situ doped in silicon. Thus, the second semiconductor material layer 26 may be in situ doped.

The in situ doping growth method may be relatively easy to control; and a gradient doping may be obtained. Further, it may also avoid the damage caused by an ion implantation process to the second semiconductor material.

In one embodiment, when the second semiconductor material layer 26 is being formed by the in situ doping growth process, the second semiconductor material layer 26 may also be doped with phosphorous ions. The doping dosage of the phosphorous ions may be greater than the doping dosage of the potential barrier-reducing ions. The phosphorous ions may locate on the non-substitution positions of the crystal lattice of the second semiconductor material layer 26. During the subsequent thermal annealing process for forming a metal silicide layer, the phosphorous ions may be activated to occupy the substitution positions of the crystal lattice of the second semiconductor material layer 26. The contact resistance of the second semiconductor material layer 26 may be reversely proportional to the doping dosage of the phosphorous ions (No, n-type doping concentration). Thus, the doping of the phosphorous ions in the second semiconductor layer 26 and increasing the doping dosage of the phosphorous ions in the second semiconductor material layer 26 may reduce the contact resistance of the second semiconductor material layer 26.

In certain other embodiments, the second semiconductor material layer 26 may not be doped with the phosphorous ions during the in situ doping growth process. The phosphorous ions in the first semiconductor material layer 25 may diffuse into the second semiconductor material layer 26 during the subsequent thermal annealing process for forming the metal silicide layer. The contact resistance of the second semiconductor layer 26 may also be reduced.

In certain other embodiments, the second semiconductor material layer may be formed on the exposed fin by an epitaxial growth process first. Then, an ion implantation process may be performed on the second semiconductor material layer to dope the potential barrier-reducing ions into the second semiconductor material layer.

After forming the second semiconductor material layer 26, a metal layer 28 may be formed on the second semiconductor material layer 26. The metal layer may be made of any appropriate metal, such as Cu, Ni, Mo, Pt, Ta, Ti, W, or Co, etc. In one embodiment, the metal layer is made of Ni. The grain size of Ni silicide subsequently formed by the thermal annealing process may be relatively small. The lower resistance phase of Ni silicide may fully be nuclei and grow into the grains. Further, because the grain size of Ni silicide may be relatively small, it may be relatively easy to form a metal contact on the Ni silicide layer.

Further, after forming the metal layer, a thermal annealing process may be performed on the metal layer; and a metal silicide layer may be formed. In one embodiment, the metal silicide layer is a Ni silicide layer ($NiSi_2$).

The thermal annealing process may be any appropriate thermal annealing process. In one embodiment, the thermal annealing process is a rapid thermal annealing (RTA) process. The temperature of the RTA process may be in a range of approximately 150° C.-900° C.

During the thermal annealing process, the metal layer and the second semiconductor material layer 26 may react. That is, the metal layer and the second semiconductor material layer 26 may be melted together and react with each other to form the metal silicide layer. The metal silicide layer may reduce the contact resistance between the source region and the metal via formed on the source region, and the contact resistance between the drain region and the metal via formed on the drain region.

In one embodiment, the thickness of the second semiconductor material layer 26 may be greater than the thickness of the metal silicide layer. The second semiconductor material layer 26 may be doped with the phosphorous ions; and the resistance of the second semiconductor material layer 26 may be reduced. Thus, the contact resistance between the subsequently formed source contact via and the source region and the contact resistance between the subsequently formed drain contact via and the drain region may not be affected.

During the thermal annealing process for forming the meal silicide layer, the solid solubility of the potential barrier-reducing ions in the metal silicide layer may be lower than the solid solubility of the potential barrier-reducing ions in the semiconductor material layer 26. Thus, a large quantity of the potential barrier-reducing ions may be precipitated at the bottom boundary of the metal silicide layer. That is, the potential barrier-reducing ions may be precipitated at the interface layer between the metal silicide layer and the second semiconductor material layer 26. The interface layer may reduce the contact resistance between the metal silicide layer and the second semiconductor material layer 26. Thus, the interface layer may also be referred as a contact resistance-reducing layer. A dipole layer may be formed between the contact resistance-reducing layer and the second semiconductor material layer 26. The dipole layer may generate an electric field with a direction identical to the moving direction of electrons. Thus, the potential barrier width and height for the carriers in the second semiconductor material layer 26 to transit from the second semiconductor layer 26 and to a metal (metal via) may be reduced; and the carriers of the second semiconductor layer 26 may directly transit to the metal. That is, the Schottky barrier width and the schottky barrier height (On) may be reduced. Thus, the parasitic capacitance (pc) of the source region and the drain region of the subsequently formed N-type FinFET may be further reduced; and the performance of the subsequently formed N-type FinFET may be improved.

When the potential barrier-reducing ions in the second semiconductor layer 26 are one or more types of S ions, Se ions, As ions and Sb ions, the doping dosage of the potential barrier-reducing ions may be in a range approximately 1E13 atom/$cm^2$-1E15 atom/$cm^2$. When the potential barrier-reducing ions are more than one type of such ions, the doping dosage may be the total dosage of the more than one type of ions. If the doping dosage of potential barrier-reducing ions is significantly large, a significantly large amount of crystal defects may be formed in the second semiconductor material layer 26. Thus, the performance of the subsequently formed N-type FinFET may be affected. If the doping dosage of potential barrier-reducing ions is substantially small, the effect for reducing the parasitic capacitance on the source region and the drain region of the subsequently formed N-type FinFET may be not as desired.

When the potential barrier-reducing ions in the second semiconductor layer 26 are germanium ions, it may be difficult for the second semiconductor material layer 26 doped with the germanium ions and the metal layer to form the metal silicide layer. Thus, the doping dosage of the germanium ions may be relatively small. In one embodiment, the doping dosage of the germanium ions may be in a range approximately 1E13 atom/$cm^2$-1E14 atom/$cm^2$. If the doping dosage of germanium ions is significantly large, a significantly large amount of crystal defects may be formed in the second semiconductor material layer 26. Further, it may affect the subsequent formation of the metal silicide layer. If the doping dosage of germanium ions is substantially small, the effect for reducing the parasitic capacitance on the source region and the drain region of the subsequently formed N-type FinFET may not be as desired.

When the potential barrier-reducing ions are a mixture of germanium ions and other potential barrier-reducing ions, the total doping dosage of germanium ions and other portion barrier-reducing ions may be in a range of approximately 1E13 atom/cm$^2$-1E15 atom/cm$^2$. The ratio of germanium ions in the mixture may be minimized.

In one embodiment, the first semiconductor material layer 25 may not be doped with potential barrier-reducing ions. During the thermal annealing process for forming the metal silicide layer, the potential barrier-reducing ions may only be precipitated at the interface layer between the contact resistance-reducing layer and the second semiconductor material layer 26 because of the solid solubility differences of the potential barrier-reducing ions in the metal silicide layer and the semiconductor layer. As a result, the dipole layer may be formed at the interface between the resistance-reducing layer and the second semiconductor material layer 26. If the potential barrier-reducing ions are doped in the first semiconductor material layer 25, the potential barrier-reducing ions may not be precipitated because the solid solubility of potential barrier-reducing ions may be similar in the first semiconductor material layer 25 and the second semiconductor material layer 26. Accordingly, no dipole layer may be formed.

In certain other embodiments, the thickness of the second semiconductor material layer may be identical to the thickness of the metal silicide layer. That is, the second semiconductor material layer may be entirely reacted with the metal layer to form the metal silicide layer. During the fabrication of the metal silicide layer, a large quantity of the potential barrier-reducing ions may be precipitated at the bottom boundary of the metal silicide layer. That is, the potential barrier-reducing ions may be precipitated at the interface layer between the metal silicide layer and the first semiconductor material layer 25. A dipole layer may be formed between the metal silicide layer and the first semiconductor material layer 25. The dipole layer may generate an electric field with a direction identical to the moving direction of electrons. Thus, the potential barrier width and height for the carriers in the first semiconductor material layer 25 to transit from the first semiconductor layer 25 and to a metal (metal via) may be reduced. That is, the Schottky barrier width and the Schottky barrier may be reduced. Thus, the parasitic capacitance of the source region and the drain region of the subsequently formed N-type FinFET may be further reduced; and the performance of the subsequently formed N-type FinFET may be improved.

After forming the metal silicide layer, an interlayer dielectric layer (not shown) may be formed on the semiconductor substrate 20. The interlayer dielectric layer may cover the sidewall spacers; and expose the metal silicide layer. The first semiconductor layer 25 doped with the source and drain ions may form the source region and drain region of N-type FinFET.

Thus, an N-type FinFET may be formed by the disclosed methods and processes. The corresponding N-type FinFET may refer to FIG. 3 and FIG. 9. As shown in FIG. 3 and FIG. 9, the N-type FinFET may include a semiconductor substrate 20 including a silicon substrate 201 and an insulation layer 202 formed on the silicon substrate 201; and at least one fin 21 formed on the semiconductor substrate 20. The N-type FinFET may also include a gate structure 22 crossing over the fin 21 formed on the semiconductor substrate 20; and sidewall spacers (not labeled) having silicon oxide spacers 23 and silicon nitride spacers 24 exposing a top portion of the fin 21 formed on side surfaces of the fin 21. Further, the N-type FinFET may also include a first semiconductor layer 25 doped with source and drain ions, and configured as a source region and a drain region formed on the exposed portion of the fin 21 at the two sides of the gate structure 22, respectively. The detailed structures and intermediate structures are described above with respect to the fabrication processes.

According to the disclosed methods and structures, when an ion implantation process is performed on the fin at two sides of the gate structure, the ion implantation process may only be performed on one of the two side surfaces of the fin. Because the distance between the two side surfaces of the fin may be substantially small, during the subsequent thermal annealing process, the doping ions may diffuse to the other side surface of the fin; and may be activated. Thus, the ion implanting regions may be formed.

Further, the entire fin may only undergo one time ion implantation process to form ion implanting regions. Thus, comparing with conventional methods using the ion implantation process twice, the damage to the fin may be significantly reduced, especially the top surface of the fin. Accordingly, the performance of the FinFET may be improved.

Further, after the ion implantation process, the crystal lattice structure near the side surface of fin receiving the doping ions may be damaged. However, the crystal lattice structure near the other side surface of the fin may not be damaged; and may be single crystalline. During the subsequent thermal annealing process, the single crystalline portion of the fin may regrow to the damaged side of the fin. Thus, the majority of the crystal lattice defects caused by the ion implantation process may be repaired after the thermal annealing process. Accordingly, the performance of the FinFET may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating an N-type fin field-effect transistor, comprising:
   providing a semiconductor substrate;
   forming at least one fin having a first side surface and a second side surface over the semiconductor substrate;
   forming a gate structure crossing over the fin and over the semiconductor substrate;
   performing an ion implantation process on only the first side surface of the fin and on two sides of the gate structure;
   performing a thermal annealing process such that doping ions are diffused into the other of the first side surface and the second side surface of the fin; and
   forming a source region and a drain region on the fin at the two sides of the gate structure, respectively.

2. The method according to claim 1, wherein:
   an angle between a direction of the ion implantation process and a normal direction perpendicular to a top surface of the semiconductor substrate is greater than approximately 0°, and equal to or smaller than 30°.

3. The method according to claim 1, wherein:
the ion implantation process is a lightly-doped drain (LDD) ion implantation process.

4. The method according to claim 1, wherein:
the doping ions used in the ion implantation process are one of arsenic ions and phosphorous ions.

5. The method according to claim 4, wherein, when the doping ions are arsenic ions,
the ion implantation process uses an energy in a range of approximately 200 eV-5 KeV; and
a doping dosage is in a range of approximately 1E13 atom/cm$^2$-2E15 atom/cm$^2$.

6. The method according to claim 4, wherein, when the doping ions are phosphorous ions,
the ion implantation process uses an energy in a range of approximately 100 eV-5 KeV; and
a doping dosage is in a range of approximately 1E13 atom/cm$^2$-2E15 atom/cm$^2$.

7. The method according to claim 1, after forming the gate structure, further comprising:
forming a first sidewall spacer material layer on the first side surface of the fin, the second side surface of the fin, a top surface of the fin, and side and top surfaces of the gate structure.

8. A method for fabricating an N-type fin field-effect transistor, comprising:
providing a semiconductor substrate;
forming at least one fin having a first side surface and a second side surface over the semiconductor substrate;
forming a gate structure crossing over the fin and over the semiconductor substrate;
forming a first sidewall spacer material layer on the first side surface of the fin, the second side surface of the fin, a top surface of the fin, and side and top surfaces of the gate structure;
performing an ion implantation process on one of the first side surface and the second side surface of the fin and at two sides of the gate structure;
performing a thermal annealing process such that doping ions are diffused into the other of the first side surface and the second side surface of the fin;
forming a second sidewall spacer material layer on the first sidewall spacer material layer;
forming initial sidewall spacers by performing an etch back process on the first sidewall spacer material layer and the second sidewall spacer material layer;
removing a top portion of the initial sidewall spacers at the two sides of the gate structure to form sidewall spacers with a first sidewall height to expose a top portion of the fin;
removing a portion of the exposed top portion of the fin at the two sides of the gate structure to reduce an initial height of the fin to a first fin height; and
forming a source region and a drain region on the fin at the two sides of the gate structure, respectively.

9. The method according to claim 8, wherein:
a height for the removed portion of the fin is greater than or equal to approximately 1/6 of the initial height the fin, and smaller than or equal to approximately 1/3 of the initial height of the fin.

10. The method according to claim 9, wherein:
the first fin height is greater than the first sidewall height.

11. The method according to claim 8, wherein forming the source region and the drain region comprises:
forming a first semiconductor material layer on the exposed top portion of the fin; and
forming a second semiconductor layer doped with potential barrier-reducing ions on the first semiconductor material layer.

12. The method according to claim 11, wherein:
the first semiconductor material layer is formed by an in situ doping growth process; and
the second semiconductor material layer is formed by an in situ doping growth process.

13. The method according to claim 11, wherein:
the first semiconductor layer is made of one of silicon carbide and silicon; and
the second semiconductor layer is made of silicon.

14. The method according to claim 11, further comprising:
forming a metal layer on the second conductor layer; and
performing a thermal annealing process on the metal layer and the second semiconductor layer to form a metal silicide layer.

15. The method according to claim 11, further comprising:
the potential barrier-reducing ions include one or more of S ions, Se ions, As ion, Sb ions and Ge ions.

* * * * *